United States Patent
Yamazaki et al.

(10) Patent No.: US 7,265,383 B2
(45) Date of Patent: Sep. 4, 2007

(54) LIGHT EMITTING DEVICE

(75) Inventors: Yu Yamazaki, Tokyo (JP); Aya Anzai, Kanagawa (JP); Tomoyuki Iwabuchi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 10/724,872

(22) Filed: Dec. 2, 2003

(65) Prior Publication Data

US 2004/0245529 A1 Dec. 9, 2004

(30) Foreign Application Priority Data

Dec. 13, 2002 (JP) ............................. 2002-361853

(51) Int. Cl.
*H01L 29/04* (2006.01)
*H01L 29/15* (2006.01)

(52) U.S. Cl. .................. 257/59; 257/72; 257/E33.072

(58) Field of Classification Search .................. 257/79, 257/72, 59, E33.072
See application file for complete search history.

(56) References Cited

U.S. PATENT DOCUMENTS

| | | | |
|---|---|---|---|
| 6,304,309 B1 * | 10/2001 | Yamanaka et al. | 349/156 |
| 6,466,292 B1 | 10/2002 | Kim | |
| 6,512,504 B1 | 1/2003 | Yamauchi et al. | |
| 6,580,488 B2 | 6/2003 | Kim | |
| 6,677,610 B2 * | 1/2004 | Choi et al. | 257/59 |
| 6,888,318 B2 | 5/2005 | Childs | |
| 6,909,240 B2 | 6/2005 | Osame et al. | |
| 2001/0055384 A1 * | 12/2001 | Yamazaki et al. | 379/419 |
| 2002/0037754 A1 | 3/2002 | Hama et al. | |
| 2002/0044782 A1 * | 4/2002 | Kota et al. | 396/661 |
| 2002/0191135 A1 | 12/2002 | Kim | |
| 2004/0245918 A1 | 12/2004 | Lee | |
| 2004/0251823 A1 | 12/2004 | Park et al. | |
| 2005/0052142 A1 | 3/2005 | Iwabuchi et al. | |

(Continued)

FOREIGN PATENT DOCUMENTS

EP 0 881 617 12/1998

(Continued)

OTHER PUBLICATIONS

Kwan Hee Lee et al.; "QCIF Full Color Transparent AMOLED Display"; *SID 03 Digest*; pp. 104-107; 2003.

(Continued)

*Primary Examiner*—Jerome Jackson
*Assistant Examiner*—Joseph Nguyen
(74) *Attorney, Agent, or Firm*—Fish & Richardson P.C.

(57) ABSTRACT

The invention provides a light emitting device which is capable of displaying on both sides, has a small volume, and is capable of being used as a module. A light emitting element represented by an EL element and the like is used in a pixel portion, and two pixel portions are provided in one light emitting device. A first pixel portion has a structure to emit light only from a counter electrode side of the light emitting element. A second pixel portion has a structure to emit light only from a pixel electrode side of the light emitting element. That is, in the first pixel portion and the second pixel portion, directions of light emission are reverse in front and back.

32 Claims, 7 Drawing Sheets

U.S. PATENT DOCUMENTS

2005/0062407 A1    3/2005    Suh et al.

FOREIGN PATENT DOCUMENTS

| | | |
|---|---|---|
| EP | 1 227 390 | 7/2002 |
| JP | 01-253791 | 10/1989 |
| JP | 02-134696 | 5/1990 |
| JP | 08-152619 | 6/1996 |
| JP | 10-255976 | 9/1998 |
| JP | 10-268250 | 10/1998 |
| JP | 2001-51251 | 2/2001 |
| JP | 2001-086205 | 3/2001 |
| JP | 2001-155856 | 6/2001 |
| JP | 2001-274880 | 10/2001 |
| JP | 2001-285445 | 10/2001 |
| JP | 2001-297885 | 10/2001 |
| JP | 2001-305525 | 10/2001 |
| JP | 2001-312228 | 11/2001 |
| JP | 2001-332392 | 11/2001 |
| JP | 2001-345184 | 12/2001 |
| JP | 2001-356714 | 12/2001 |
| JP | 2002-006787 | 1/2002 |
| JP | 2002-014336 | 1/2002 |
| JP | 2002-148604 | 5/2002 |
| JP | 2002-158757 | 5/2002 |
| JP | 2002-343564 | 11/2002 |
| JP | 3408154 | 3/2003 |
| JP | 3408154 | 5/2003 |
| JP | 2003-317959 | 11/2003 |
| JP | 2003-345271 | 12/2003 |
| WO | WO99-018590 | 4/1999 |

OTHER PUBLICATIONS

International Search Report (Application No. PCT/JP03/15705), Mar. 2, 2002, 3 pages (In Japanese).

International Preliminary Examination Report (Application No. PCT/JP03/15705), Mar. 30, 2004, 6 pages (Partial Translation).

Exhibition of Active Matrix Type Organic EL Display at "13th Flat Panel Display Manufacturing Technology Expo & Conference" by ELDis Group (*in Japanese with full translation*); Jul. 2, 2003.

Documents distributed in the "13th Flat Panel Display Manufacturing Technology Expo & Conference" by ELDis Group (5 pages).

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

International Search Report (Application No. PCT/JP03/16030; PCT6845) dated Feb. 24, 2004, 3 pages.

International Preliminary Report (Application No. PCT/JP2003/016030; PCT6845) dated Jun. 9, 2005, 4 pages.

* cited by examiner

FIG. 4
(A)
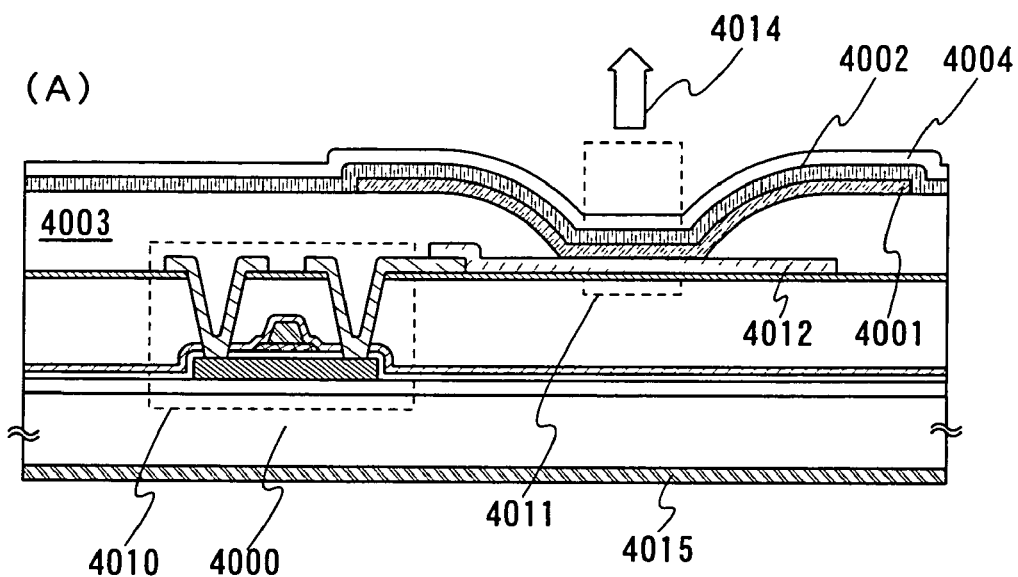
(B)
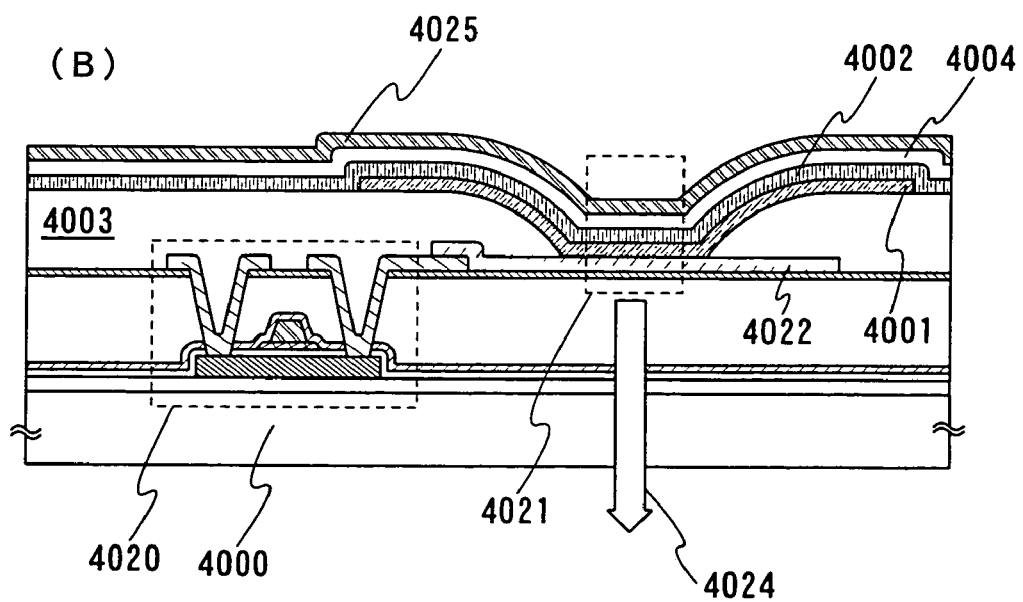

LIGHT EMITTING DEVICE

TECHNICAL FIELD

The invention relates to a light emitting device provided with a light emitting element. In particular, the invention relates to a portable information terminal such as a portable phone and a PDA (Personal Digital Assistance) provided with such a light emitting device.

BACKGROUND ART

In recent years, a light emitting device using a light emitting element represented by an electroluminescent (EL) element and the like has been developed in substitution for a liquid crystal display (LCD) comprising a pixel using a liquid crystal element as a light emitting element. These light emitting devices are expected to be widely used as a display of a portable phone and a display device by taking advantages of high image quality, wide viewing angle, thin design without a need of backlight, lightweight and the like due to a light emission type.

Furthermore, a portable information terminal is demanded to have a high-value added because of the diversification of applications and is recently provided with a sub-display on the back of a normal display.

DISCLOSURE OF THE INVENTION

Problems to be Solved by the Invention

In a portable information terminal provided with a sub-display in addition to the original display, the volume occupied by a module including a backlight and the like as well as the volume occupied by a substrate and the like mounting a control IC and the like for driving the aforementioned module are to be paid attention to. In particular, a portable information terminal provided recently is becoming thinner, lighter, and smaller, which is in the relation of trade-off with the added high-value.

The invention is made in view of the aforementioned problems and provides a light emitting device which is capable of displaying on both sides, has a small volume, and is capable of being used as a module.

MEANS FOR SOLVING THE PROBLEM

Following measures are taken in the invention to solve the aforementioned problems.

A light emitting element represented by an EL element and the like is used in a pixel portion and two pixel portions are provided at different dispositions in one light emitting device. A first pixel portion has a structure to emit light only from a counter electrode side of the light emitting element. A second pixel portion has a structure to emit light only from a pixel electrode side of the light emitting element. That is, in the first pixel portion and the second pixel portion, directions of light emission are reverse in front and back.

A user normally does not look at the both sides at the same time, therefore, the display may be selected according to the application. For example, such a structure may be employed that a switching element is provided in any of current paths for supplying current to the light emitting element in order to block a current supply to the second pixel portion when utilizing the light emission of the first pixel portion, while in order to block a current supply to the first pixel portion when utilizing the light emission of the second pixel portion. In that case, in a light emitting device comprising a first driving portion for operating the first pixel portion, a second driving portion for operating the second pixel portion, and a wiring for supplying a signal and a voltage to each of the first driving portion and the second driving portion, such a structure that a part or all of the wirings for supplying a signal and a voltage to the first driving portion and the second driving portion is shared and a means for operating either of the first pixel portion or the second pixel portion is provided and changed over externally.

A structure of the invention is described below.

The light emitting device of the invention comprises a first pixel portion in which a plurality of first pixels are arranged in matrix on a panel substrate and a second pixel portion in which a plurality of second pixels are arranged in matrix on the panel substrate at a different disposition than the first pixel portion. The first pixel portion comprises the plurality of first pixels comprising first light emitting elements which emit light from a surface of the panel substrate in a direction from the back of the panel substrate to the surface of the substrate, and the second pixel portion comprises the plurality of second pixels comprising second light emitting elements which emit light from the back of the panel substrate in a direction from the surface of the panel substrate to the back of the panel substrate.

In the light emitting device of the invention, the first light emitting element comprises a first pixel electrode, a first electroluminescent layer, and a first counter electrode. The first pixel portion emits light from the first counter electrode side, the second light emitting element comprises a second pixel electrode, a second electroluminescent layer, and a second counter electrode, and the second pixel portion emits light from the second pixel electrode side.

In the light emitting device of the invention, directions of light emitted from the first light emitting element and the second light emitting element are determined depending upon the presence or absence of a reflecting film.

In the light emitting device of the invention, the first driving portion for operating the first pixel portion, the second driving portion for operating the second pixel portion, and a part or all of the wirings for supplying a signal and a voltage to each of the first driving portion and the second driving portion is shared, and a means for operating either of the first pixel portion or the second pixel portion is provided.

In the light emitting device of the invention, the light emitting device is used in an electronic apparatus.

EFFECT OF THE INVENTION

According to the aforementioned structure of the invention, a light emitting device which is thin, lightweight, and capable of displaying on both sides can be provided. Further, the number of input signals can be reduced by changing over or sharing a signal and a voltage which are required for driving depending on a pixel portion to drive.

The invention can be applied not only to a light emitting device using an electroluminescent element as a light emitting element, but also to other light emitting devices.

BRIEF DESCRIPTION OF THE DRAWINGS

FIGS. 4(A) and 4(B) are cross sectional views showing structures of a pixel portion of the light emitting device in Embodiment Mode 4.

BEST MODE FOR CARRYING OUT THE INVENTION

Embodiment Modes of the invention are described below.

Embodiment Mode 1

Figure 1:
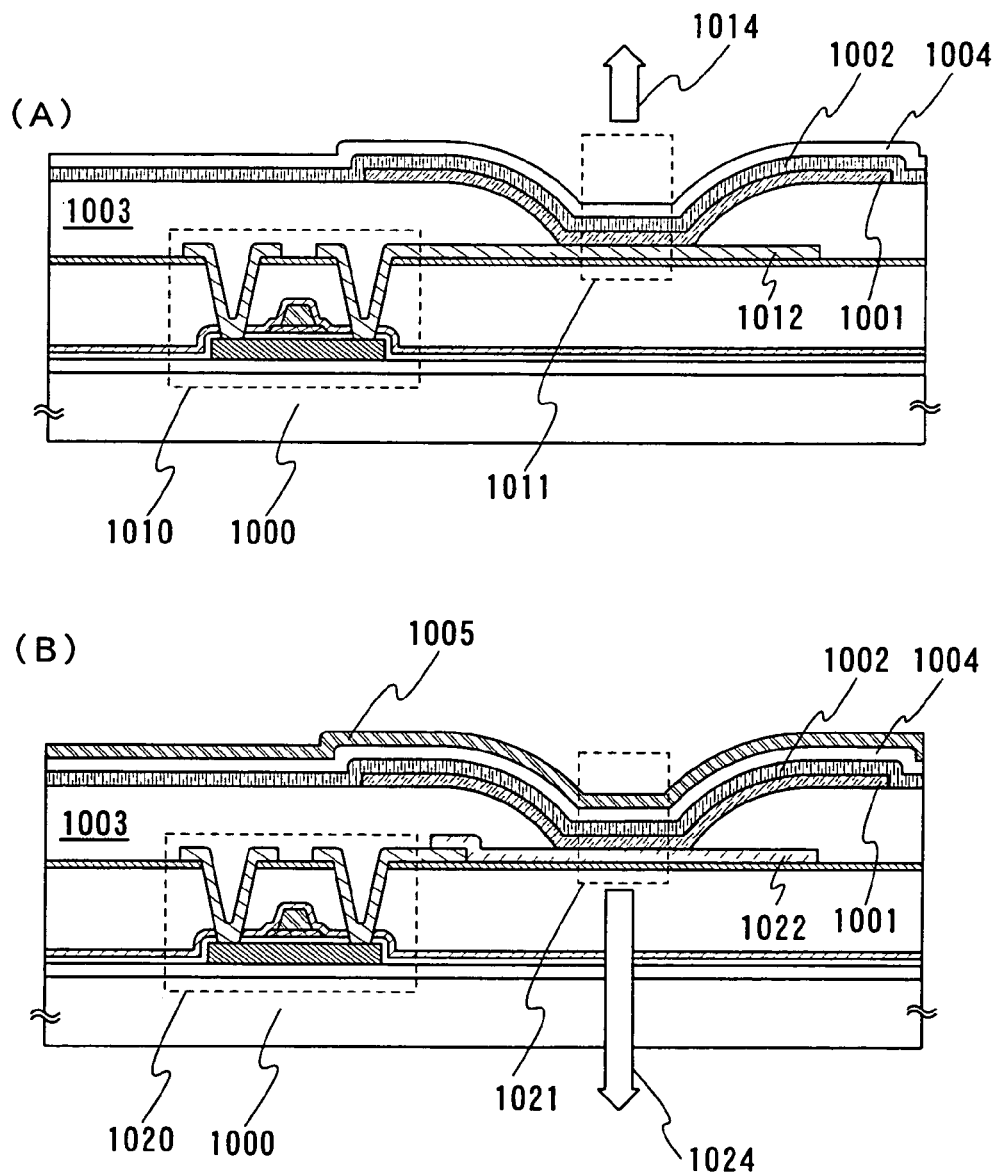
FIGS. 1(A) and 1(B) are cross sectional views showing structures of a pixel portion of the light emitting device in Embodiment Mode 1.

One embodiment mode of the invention is shown in FIG. 1. FIG. 1 are cross sectional views of a first pixel portion and a second pixel portion of one light emitting device provided with two pixel portions. The first pixel portion has a structure to emit light only from a counter electrode side of the light emitting element while the second pixel portion has a structure to emit light only from a pixel electrode side of the light emitting element. That is, in the first pixel portion and the second pixel portion, directions of light emission are reverse in front and back.

Figure 5:
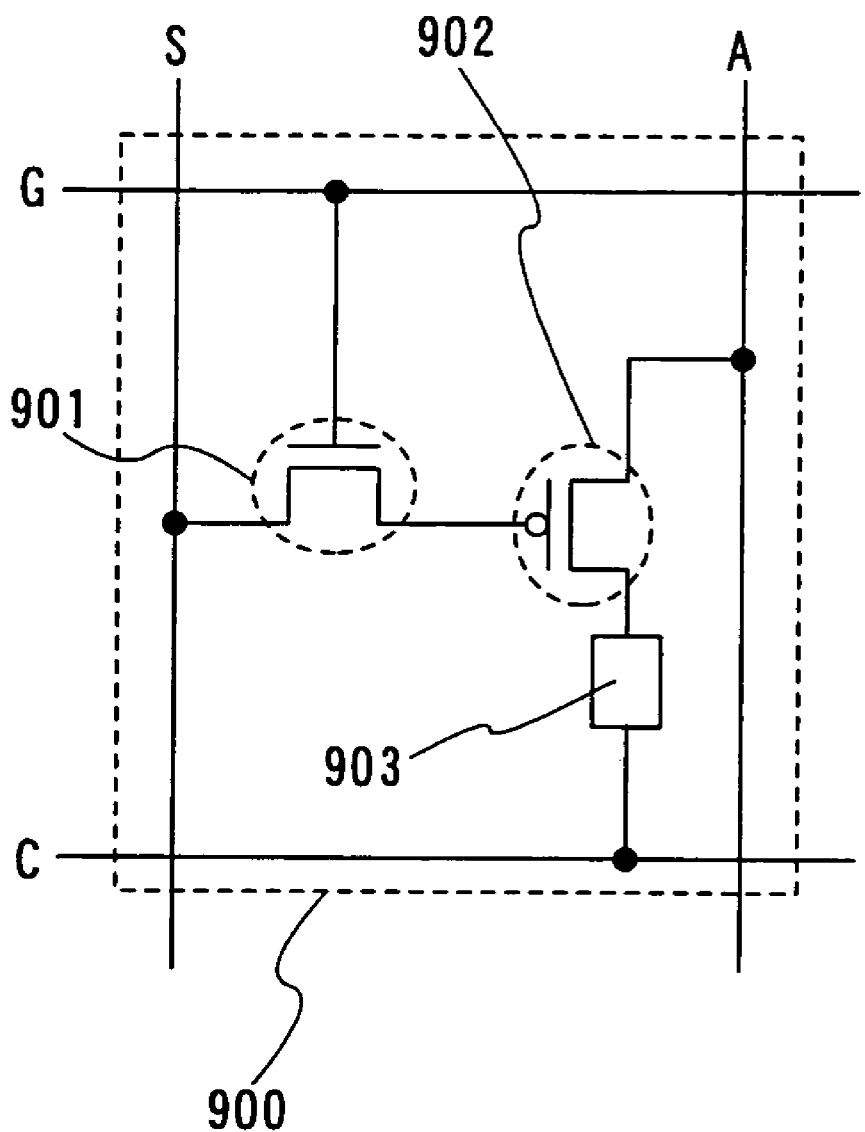
FIG. 5 is a circuit diagram showing a structure of a pixel portion of the light emitting device.

FIG. 1A is a cross sectional view of one pixel in the first pixel portion and FIG 1B is a cross sectional view of one pixel in the second pixel portion. FIG. 5 shows a circuit diagram of one pixel in the first pixel portion and the second pixel portion as an example.

Note that a thin film transistor (TFT) is used as a switching element and a driving element here, however, the invention is not limited to this. For example, any of a MOS transistor, an organic transistor, a molecular transistor and the like may be used as well.

In FIG. 5, reference numeral 900 denotes a pixel, 901 denotes a switching TFT, 902 denotes a driving TFT, and 903 denotes a light emitting element. Further, a symbol A denotes an anode line, C denotes a cathode line, G denotes a gate line, and S denotes a source line.

In FIG. 1A, reference numeral 1000 denotes a substrate and a region surrounded by a dashed frame 1010 corresponds to a driving TFT which supplies a current to a light emitting element 1011 directly or through other circuit elements. The light emitting element 1011 corresponds to a region in which a pixel electrode 1012, an electroluminescent layer 1001, and a counter electrode 1002 are laminated and emits light in a direction shown by a light emitting direction 1014. The pixel electrode 1012 at this time is formed of a reflecting film such as aluminum, therefore, the light emitting element 1011 does not emit light in the opposite direction to the light emitting direction 1014. Note that the pixel electrode 1012 may have a structure in which a transparent conductive film is laminated on a reflecting film. The counter electrode 1002 laminated above the electroluminescent layer 1001 is formed of a transparent conductive film such as ITO while a protective film 1004 is formed of a transmissive film such as a carbon nitride film. Reference numeral 1003 denotes an organic resin film.

In FIG. 1B, a region surrounded by a dashed frame 1020 corresponds to a driving TFT which supplies a current to a light emitting element 1021 directly or through other circuit elements. The light emitting element 1021 corresponds to a region in which a pixel electrode 1022, the electroluminescent layer 1001, and the counter electrode 1002 are laminated and emits light in a direction shown by a light emitting direction 1024. The pixel electrode 1022 is formed of a transparent conductive film and a film formed below the pixel electrode 1022 and the substrate 1000 are formed of materials which transmit light. Further, a reflecting film 1005 is formed on the protective film 1004 and reflects light emitted from the light emitting element 1021 in the opposite direction to the light emitting direction 1024. Reference numeral 1003 denotes an organic resin film.

The electroluminescent layer 1001 is the same layer in FIG. 1A and FIG. 1B, however, it may be formed of a different material. The electroluminescent layers may be formed of different materials in each pixel.

The protective film 1004 is the same layer in FIG. 1A and FIG. 1B, however, it may be formed of a different material.

Further, the electroluminescent layer 1001 may be formed of any of a low molecular weight material, a high molecular weight material, or a medium molecular weight material.

After the light emitting device is completed up to the mode shown in FIG. 1, it is preferably packaged (sealed) with a protective film (laminate film, ultraviolet curing resin film and the like) which has high airtightness and less degasification or a translucent covering material in order not to expose it to the outside air.

Embodiment Mode 2

Figure 2:
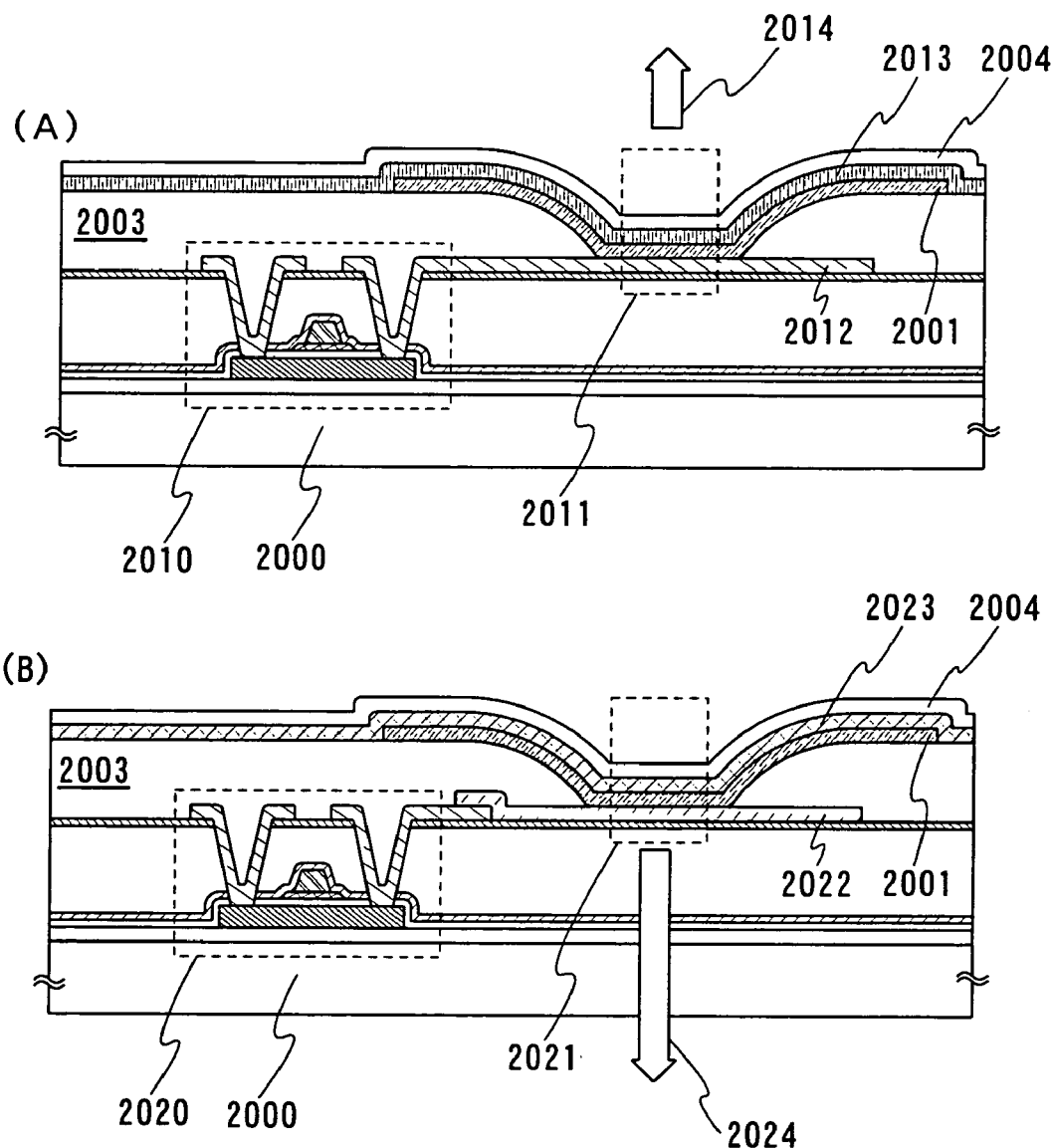
FIGS. 2(A) and 2(B) are cross sectional views showing structures of a pixel portion of the light emitting device in Embodiment Mode 2.

One embodiment mode of the invention is shown in FIG. 2. FIG. 2 are cross sectional views of a first pixel portion and a second pixel portion of one light emitting device provided with two pixel portions. The first pixel portion has a structure to emit light only from a counter electrode side of the light emitting element while the second pixel portion has a structure to emit light only from a pixel electrode side of the light emitting element. That is, in the first pixel portion and the second pixel portion, directions of light emission are reverse in front and back.

FIG. 2A is a cross sectional view of one pixel in the first pixel portion and FIG. 2B is a cross sectional view of one pixel in the second pixel portion. FIG. 5 shows a circuit diagram of one pixel in the first pixel portion and the second pixel portion as an example.

In FIG. 5, reference numeral 900 denotes a pixel, 901 denotes a switching TFT, 902 denotes a driving TFT, and 903 denotes a light emitting element. Further, a symbol A denotes an anode line, C denotes a cathode line, G denotes a gate line, and S denotes a source line.

In FIG. 2A, reference numeral 2000 denotes a substrate, and a region surrounded by a dashed frame 2010 corresponds to a driving TFT which supplies a current to a light emitting element 2011 directly or through other circuit elements. The light emitting element 2011 corresponds to a region in which a pixel electrode 2012, an electroluminescent layer 2001, and a counter electrode 2013 are laminated and emits light in a direction shown by a light emitting direction 2014. The pixel electrode 2012 at this time is formed of a reflecting film such as aluminum, therefore, the light emitting element 2011 does not emit light in the opposite direction to the light emitting direction 2014. Note that the pixel electrode 2012 may have a structure in which a transparent conductive film is laminated on a reflecting film. A counter electrode 2013 laminated above the electroluminescent layer 2001 is formed of a transparent conductive film, a protective film 2004 is formed of a transmissive film such as a carbon nitride film. Reference numeral 2003 denotes an organic resin film. In FIG. 2B, a region surrounded by a dashed frame 2020 corresponds to a driving TFT which supplies a current to a light emitting element 2021 directly or through other circuit elements. The light emitting element 2021 corresponds to a region in which a pixel electrode 2022, the electroluminescent layer 2001, and a counter electrode 2023 are laminated and emits light in a direction shown by a light emitting direction 2024. The counter electrode 2023 is formed of a reflecting film such as aluminum, therefore, the light emitting element 2021 does not emit light in the opposite direction to the light emitting direction 2024. Further, the pixel electrode 2022 is formed of a transparent conductive film and a film formed below the pixel electrode 2022 and a substrate 2000 are formed of materials which transmit light. Reference numeral 2003 denotes an organic resin film.

The electroluminescent layer 2001 is the same layer in FIG. 2A and FIG. 2B, however, it may be formed of a different material. The electroluminescent layers may be formed of different materials in each pixel.

The protective film 2004 is the same layer in FIG. 2A and FIG. 2B, however, it may be formed of a different material.

The counter electrode 2013 and the counter electrode 2023 are different layers in FIG. 2A and FIG. 2B, however, they may be electrically connected to each other.

Further, the electroluminescent layer 2003 may be formed of any of a low molecular weight material, a high molecular weight material, or a medium molecular weight material.

After the light emitting device is completed up to the mode shown in FIG. 2, it is preferably packaged (sealed) with a protective film (laminate film, ultraviolet curing resin film and the like) which has high airtightness and less degasification or a translucent covering material in order not to expose it to the outside air.

Embodiment Mode 3

Figure 3:
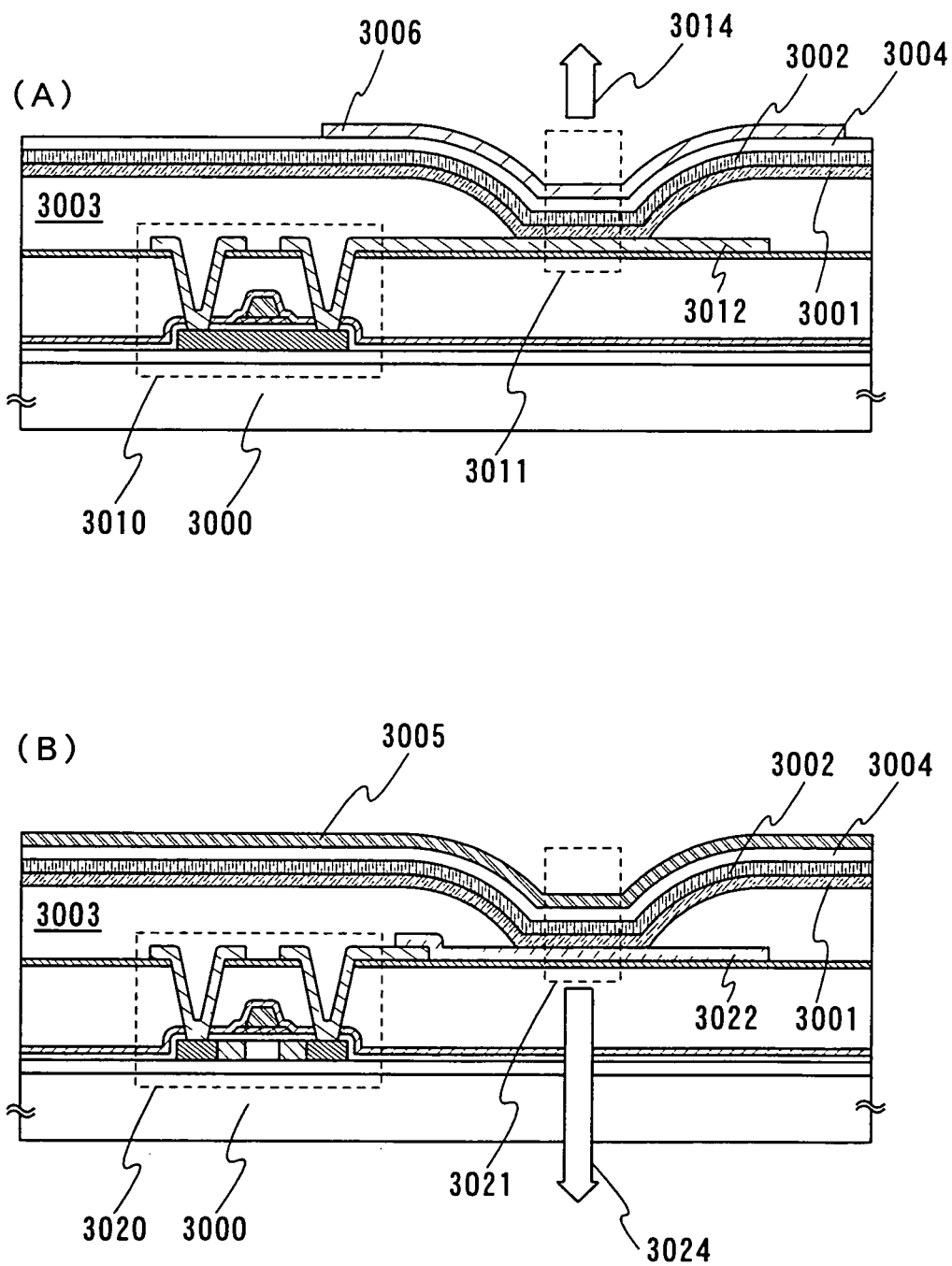
FIGS. 3(A) and 3(B) are cross sectional views showing structures of a pixel portion of the light emitting device in Embodiment Mode 3.

One embodiment mode of the invention is shown in FIG. 3. FIG. 3 are cross sectional views of a first pixel portion and a second pixel portion of one light emitting device provided with two pixel portions. The first pixel portion has a structure to emit light only from a counter electrode side of the light emitting element while the second pixel portion has a structure to emit light only from a pixel electrode side of the light emitting element. That is, in the first pixel portion and the second pixel portion, directions of light emission are reverse in front and back.

FIG. 3A is a cross sectional view of one pixel in the first pixel portion and FIG. 3B is a cross sectional view of one pixel in the second pixel portion. FIG. 5 shows a circuit diagram of one pixel in the first pixel portion and the second pixel portion as an example.

In FIG. 5, reference numeral 900 denotes a pixel, 901 denotes a switching TFT, 902 denotes a driving TFT, and 903 denotes a light emitting element. Further, a symbol A denotes an anode line, C denotes a cathode line, G denotes a gate line, and S denotes a source line.

In FIG. 3A, reference numeral 3000 denotes a substrate and a region surrounded by a dashed frame 3010 corresponds to a driving TFT which supplies a current to a light emitting element 3011 directly or through other circuit elements. The light emitting element 3011 corresponds to a region in which a pixel electrode 3012, an electroluminescent layer 3001, and a counter electrode 3002 are laminated and emits light in a direction shown by a light emitting direction 3014. The pixel electrode 3012 at this time is formed of a reflecting film such as aluminum, therefore, the light emitting element 3011 does not emit light in the opposite direction to the light emitting direction 3014. Note that the pixel electrode 3012 may have a structure in which a transparent conductive film is laminated on a reflecting film. The counter electrode 3002 laminated above the electroluminescent layer 3001 is formed of a transparent conductive film, a protective film 3004 is formed of a transmissive film such as a carbon nitride film, and a color filter 3006 is formed of color resist and the like. By using different materials for the color filter 3006 in each pixel, light can be emitted in different colors in each pixel. Reference numeral 3003 denotes an organic resin film.

In FIG. 3B, a region surrounded by a dashed frame 3020 corresponds to a driving TFT which supplies a current to a light emitting element 3021 directly or through other circuit elements. The driving TFT 3020 in FIG. 3B has an LDD region. The light emitting element 3021 corresponds to a region in which a pixel electrode 3022, the electroluminescent layer 3001, and the counter electrode 3002 are laminated and emits light in a direction shown by a light emitting direction 3024. The pixel electrode 3022 is formed of a transparent conductive film and a film formed below the pixel electrode 3022 and the substrate 3000 are formed of materials which transmit light. Further, a reflecting film 3005 is formed on the protective film 3004 and reflects light emitted from the light emitting element 3021 in the opposite direction to the light emitting direction 3024. Reference numeral 3003 denotes an organic resin film.

The protective film 3004 is the same layer in FIG. 3A and FIG. 3B, however, it may be formed of a different material.

The electroluminescent layer 3001 is the same layer in FIG. 3A and FIG. 3B, however, it may be formed of a different material. The electroluminescent layers may be formed of different materials in each pixel.

The color filter 3006 may be formed of a different material in each pixel.

Further, the electroluminescent layer 3001 may be formed of any of a low molecular weight material, a high molecular weight material, or a medium molecular weight material.

After the light emitting device is completed up to the mode shown in FIG. 3, it is preferably packaged (sealed) with a protective film (laminate film, ultraviolet curing resin film and the like) which has high airtightness and less degasification or a translucent covering material in order not to expose it to the outside air.

Embodiment Mode 4

One embodiment mode of the invention is shown in FIG. 4. FIG. 4 are cross sectional views of a first pixel portion and a second pixel portion of one light emitting device provided with two pixel portions. The first pixel portion has a structure to emit light only from a counter electrode side of the light emitting element while the second pixel portion has a structure to emit light only from a pixel electrode side of the light emitting element. That is, in the first pixel portion and the second pixel portion, directions of light emission are reverse in front and back.

FIG. 4A is a cross sectional view of one pixel in the first pixel portion and FIG. 4B is a cross sectional view of one pixel in the second pixel portion. FIG. 5 shows a circuit diagram of one pixel in the first pixel portion and the second pixel portion as an example.

Note that a thin film transistor (TFT) is used as a switching element and a driving element here, however, the invention is not limited to this. For example, any of a MOS transistor, an organic transistor, a molecular transistor and the like may be used as well.

In FIG. 5, reference numeral 900 denotes a pixel, 901 denotes a switching TFT, 902 denotes a driving TFT, and 903 denotes a light emitting element. Further, a symbol A denotes an anode line, C denotes a cathode line, G denotes a gate line, and S denotes a source line.

In FIG. 4A, reference numeral 4000 denotes a substrate and a region surrounded by a dashed frame 4010 corresponds to a driving TFT which supplies a current to a light emitting element 4011 directly or through other circuit elements. The light emitting element 4011 corresponds to a region in which a pixel electrode 4012, an electroluminescent layer 4001, and a counter electrode 4002 are laminated and emits light in a direction shown by a light emitting direction 4014. The pixel electrode 4012 at this time is formed of a transparent conductive film, however, light is not emitted from the bottom of the substrate 4000 even when the light is emitted in the opposite direction to the light emitting direction 4014 since the light is reflected on the reflecting film 4015. The counter electrode 4002 laminated above the electroluminescent layer 4001 is formed of a transparent conductive film while a protective film 4004 is formed of a transmissive film such as a carbon nitride film. Reference numeral 4003 denotes an organic resin film.

In FIG. 4B, a region surrounded by a dashed frame 4020 corresponds to a driving TFT which supplies a current to a light emitting element 4021 directly or through other circuit elements. The light emitting element 4021 corresponds to a region in which a pixel electrode 4022, the electroluminescent layer 4001, and the counter electrode 4002 are laminated and emits light in a direction shown by a light emitting direction 4024. The pixel electrode 4022 is formed of a transparent conductive film and a film formed below the pixel electrode 4022 and the substrate 4000 are formed of materials which transmit light. Further, a reflecting film 4025 is formed on the protective film 4004 and reflects light emitted from the light emitting element 4021 in the opposite direction to the light emitting direction 4024. Reference numeral 4003 denotes an organic resin film.

The electroluminescent layer 4001 is the same layer in FIG. 4A and FIG. 4B, however, it may be formed of a different material. The electroluminescent layers may be formed of different materials in each pixel.

The protective film 4004 is the same layer in FIG. 4A and FIG. 4B, however, it may be formed of a different material.

Further, the electroluminescent layer 4001 may be formed of any of a low molecular weight material, a high molecular weight material, or a medium molecular weight material.

After the light emitting device is completed up to the mode shown in FIG. 4, it is preferably packaged (sealed) with a protective film (laminate film, ultraviolet curing resin film and the like) which has high airtightness and less degasification or a translucent covering material in order not to expose it to the outside air.

EMBODIMENT

Hereinafter described is an embodiment of the invention.

Embodiment 1

A panel substrate as a part of the light emitting device of the invention is described.

Figure 6:
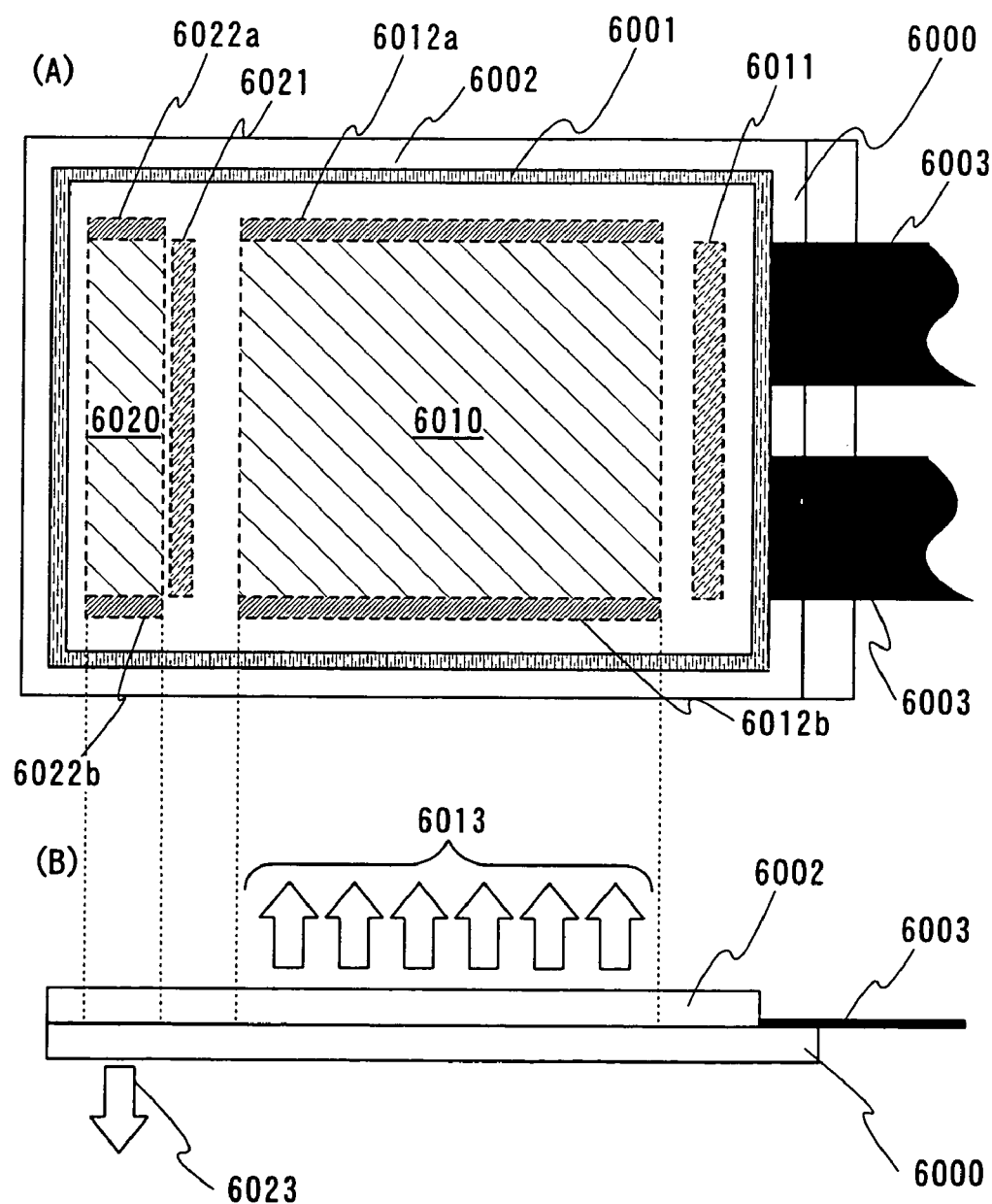
FIG. 6 is a diagram showing structures of a panel substrate as the light emitting device of the invention described in Embodiment Mode 1.

FIG. 6A is a top plan view of a panel substrate with a substrate 6000 on the bottom and a counter substrate 6002 on the top. FIG. 6B is a cross sectional view of the panel substrate. The substrate 6000 mounts a first pixel portion 6010 and a second pixel portion 6020 at a different disposition than the first pixel portion 6010. The first pixel portion 6010 emits light in a direction 6013 while the second pixel portion 6020 emits light in a direction 6023, which are reverse in front and back.

A plurality of first pixels are arranged in matrix on the first pixel portion 6010 and a plurality of second pixels are arranged in matrix on the second pixel portion 6020. Each structure of the first pixel and the second pixel is described in Embodiment Modes 1 to 4.

A space surrounded with a surface of the substrate 6000, a sealing material 6001, and the counter substrate 6002 is sealed by a filler material except for a portion attached with an FPC 6003.

The first pixel portion 6010 is connected to a source signal line driver circuit 6011 and gate signal line driver circuits 6012a and 6012b, which supply signals required for the first pixel portion 6010 to emit light The second pixel portion 6020 is connected to a source signal line driver circuit 6021, and gate signal line driver circuits 6022a and 6022b, which supply signals required for the second pixel portion 6020 to emit light.

In this embodiment, in order to operate the first pixel portion 6010 and the second pixel portion 6020, a source signal line driver circuit and a gate signal line driver circuit are provided for each of them. However, a common source signal line driver circuit and a common gate signal line driver circuit for the first pixel portion 6010 and the second pixel portion 6020 may be provided as well.

The panel substrate is supplied with a signal and a voltage/current required for driving the source signal line driver circuits 6011 and 6021, and the gate signal line driver circuits 6012a, 6012b, 6022a, and 6022b through the FPC 6003. As for wirings for supplying a signal and a voltage/current to the first pixel portion 6010, the second pixel portion 6020, the source signal line driver circuits 6011 and 6021, and the gate signal line driver circuits 6012a, 6012b, 6022a, and 6022b, the number thereof can be reduced by sharing them as required. Here, a wiring for supplying a signal to a driver circuit is referred to as a signal line while a wiring for supplying a voltage to a driver circuit is referred to as a power supply line.

A signal and a voltage/current required to drive the source signal line driver circuit 6011 and the gate signal line driver circuits 6012a and 6012b are only required to be supplied when operating the first pixel portion 6010 while a signal and a voltage/current required to drive the source signal line driver circuit 6021 and the gate signal line driver circuits 6022a and 6022b are only required to be supplied when operating the second pixel portion 6020.

In a structure that the first pixel portion 6010 and the second pixel portion 6020 do not operate at the same time, they may be changed over externally by sharing a part or all of the wirings for supplying a signal and a voltage to the source signal line driver circuit 6011 for operating the first pixel portion and the source signal line driver circuit 6021 for operating the second pixel portion and providing a means for operating either of the first pixel portion or the second pixel portion. Further, they may be changed over externally by sharing a part or all of the wirings for supplying a signal and a voltage to the gate signal line driver circuits 6012a and 6012b for operating the first pixel portion and the gate signal line driver circuits 6022a and 6022b for operating the second pixel portion and providing a means for operating either of the first pixel portion or the second pixel portion.

In a structure that a part of an image to be displayed in the first pixel portion 6010 is displayed in the second pixel portion 6020, a wiring for supplying a video signal may be shared by the source signal line driver circuit 6011 and the source signal line driver circuit 6021.

Figure 7:
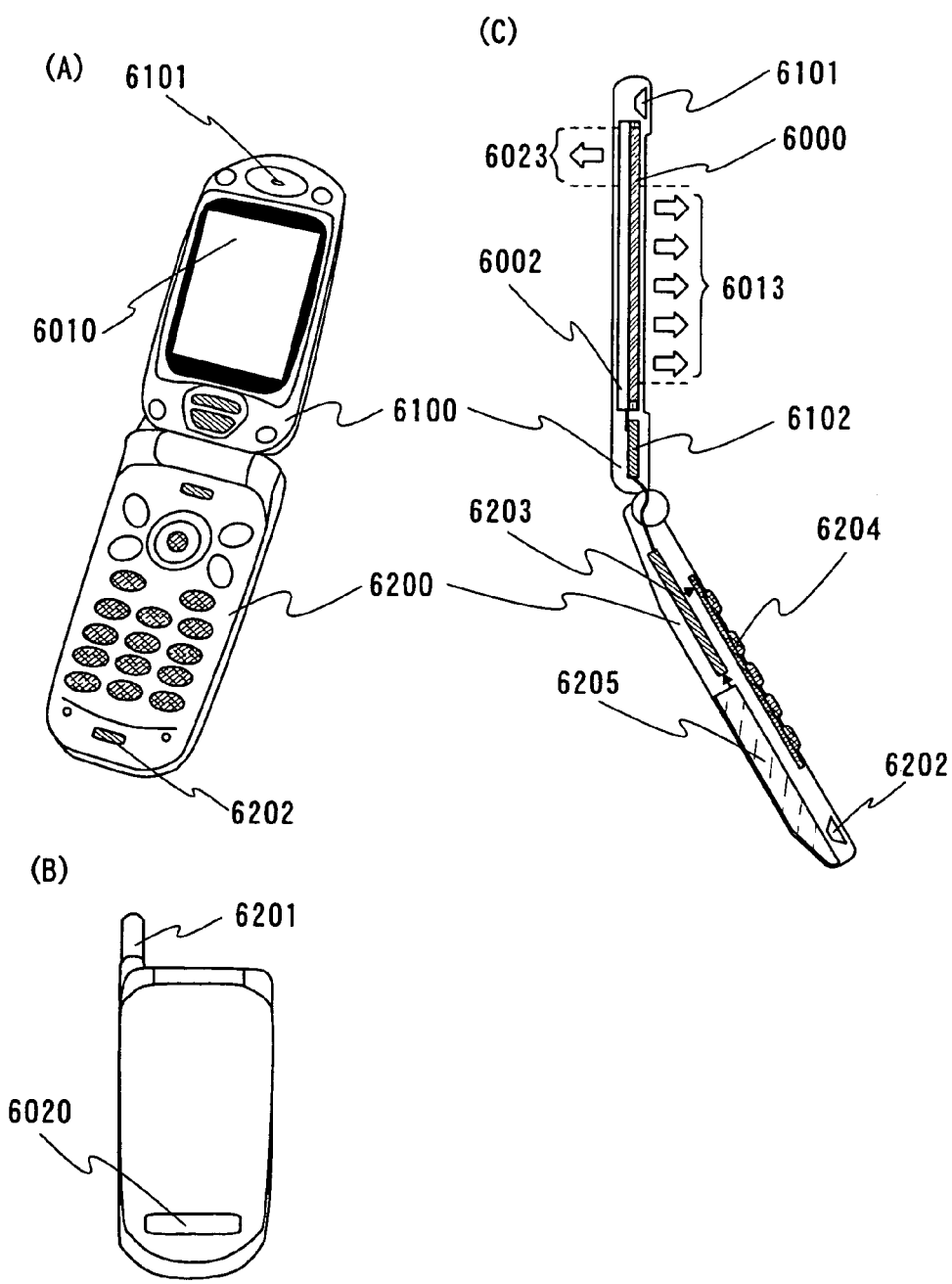
FIGS. 7(A) to 7(C) are views of a portable phone using a panel substrate as the light emitting device of the invention described in Embodiment Mode 1.

FIG. 7 is an example of using the panel substrate to an electronic apparatus, for example a flip phone.

The flip phone in FIG. 7 is formed of a first housing 6100 and a second housing 6200.

The first housing 6100 comprises a speaker 6101, a display controller 6102, and the panel substrate of the invention. Note that 6000 denotes a substrate and 6002 denotes a counter substrate.

The second housing 6200 comprises an antenna 6201, a microphone 6202, a module 6203 for driving a main body, an operating button module 6204, and a battery 6205.

FIG. 7A shows an opened flip phone. A user can look at an image displayed in the first pixel portion 6010.

FIG. 7B shows a closed flip phone. A user can look at an image displayed in the second pixel portion 6020. At this time, the user cannot look at the first pixel portion 6010, therefore, the first pixel portion 6010 is not required to display an image.

FIG. 7C shows a cross sectional view of the opened flip phone. The first pixel portion 6010 emits light in a direction 6013 while the second pixel portion emits light in a direction 6023.

The invention claimed is:

1. A light emitting device comprising:
 a first pixel portion in which a plurality of first pixels are arranged in matrix over a substrate;
 a second pixel portion in which a plurality of second pixels are arranged in matrix at a different disposition from the first pixel portion over the substrate;
 a driver circuit positioned between the first pixel portion and the second pixel portion; and
 a scaling material surrounding the first pixel portion, the second pixel portion, and the driver circuit,
 wherein each of the plurality of first pixels comprises a first light emitting element;
 wherein each of the plurality of second pixels comprises a second light emitting element; and
 wherein a direction of light emission of the first light emitting element is opposite to a direction of light emission of the second light emitting element.

2. The light emitting device according to claim 1,
 wherein the first light emitting element comprises a first pixel electrode, a first electroluminescent layer, and a first counter electrode;
 wherein the first pixel portion emits light from a side of the first counter electrode;
 wherein the second light emitting element comprises a second pixel electrode, a second electroluminescent layer, and a second counter electrode; and
 wherein the second pixel portion emits light from a side of the second pixel electrode.

3. The light emitting device according to claim 1,
 wherein the directions of light emission of the first light emitting element and the second light emitting element are determined depending upon the presence or absence of a reflecting film.

4. The light emitting device according to claim 1 further comprising:
 a first gate signal line driver circuit for operating the first pixel portion;
 a second gate signal line driver circuit for operating the second pixel portion; and
 a second source signal line driver circuit for operating the second pixel portion, wherein the driver circuit is a first source signal line driver circuit for operating the first pixel portion.

5. The light emitting device according to claim 4 further comprising a wiring for supplying a signal or a voltage to the first source signal line driver circuit and the second source signal line driver circuit, and a means for operating either of the first pixel portion or the second pixel portion.

6. An electronic apparatus using the light emitting device according to claim 1.

7. A portable phone using the light emitting device according to claim 1.

8. A personal digital assistance (PDA) using the light emitting device according to claim 1.

9. A light emitting device comprising:
 a first pixel portion in which a plurality of first pixels are arranged in matrix over a substrate;
 a second pixel portion in which a plurality of second pixels are arranged in matrix at a different disposition from the first pixel portion over the substrate;
 a driver circuit positioned between the first pixel portion and the second pixel portion; and
 a sealing material surrounding the first pixel portion, the second pixel portion, and the driver circuit,
 wherein each of the plurality of first pixels comprises a first light emitting element which emits light from a surface of the substrate in a direction from a back of the substrate to the surface of the substrate; and
 wherein each of the plurality of second pixels comprises a second light emitting element which emits light from the back of the substrate in a direction from the surface of the substrate to the back of the substrate.

10. The light emitting device according to claim 9,
 wherein the first light emitting element comprises a first pixel electrode, a first electroluminescent layer, and a first counter electrode;
 wherein the first pixel portion emits light from a side of the first counter electrode;
 wherein the second light emitting element comprises a second pixel electrode, a second electroluminescent layer, and a second counter electrode; and
 wherein the second pixel portion emits light from a side of the second pixel electrode.

11. The light emitting device according to claim 9,
 wherein the directions of light emission of the first light emitting element and the second light emitting element are determined depending upon the presence or absence of a reflecting film.

12. The light emitting device according to claim 9. further comprising:
 a first gate signal line driver circuit for operating the first pixel portion;
 a second gate signal line driver circuit for operating the second pixel portion; and
 a second source signal line driver circuit for operating the second pixel portion,
 wherein the driver circuit is a first source line driver circuit for operating the first pixel portion.

13. The light emitting device according to claim 12 further comprising a wiring for supplying a signal or a voltage to the first source signal line driver circuit and the second source signal line driver circuit, and a means for operating either of the first pixel portion or the second pixel portion.

14. An electronic apparatus using the light emitting device according to claim 9.

15. A portable phone using the light emitting device according to claim 9.

16. A personal digital assistance (PDA) using the light emitting device according to claim 9.

17. A light emitting device comprising:
a first pixel portion and a second pixel portion over a substrate;
a driver circuit positioned between the first pixel portion and the second pixel portion; and
a sealing material surrounding the first pixel portion, the second pixel portion, and the driver circuit,
wherein the first pixel portion comprises a first light emitting element that comprises:
a first pixel electrode comprising a first reflecting film;
a first electroluminescent layer over the first pixel electrode; and
a first counter electrode over the first electroluminescent layer, and
wherein the second pixel portion comprises a second light emitting element that comprises;
a second pixel electrode;
a second electroluminescent layer over the second pixel electrode;
a second counter electrode over the second electroluminescent layer; and
a second reflecting film over the second counter electrode;
wherein the first pixel portion and the second pixel portion are different from each other; and
wherein a direction of light emission of the first light emitting element is opposite to a direction of light emission of the second light emitting element.

18. The light emitting device according to claim 17 further comprising:
a first gate signal line driver circuit for operating the first pixel portion;
a second gate signal line driver circuit for operating the second pixel portion; and
a second source signal line driver circuit for operating the second pixel portion,
wherein the driver circuit is a first source signal line driver circuit for operating the first pixel portion.

19. The light emitting device according to claim 18 further comprising a wiring for supplying a signal or a voltage to the first source signal line driver circuit and the second source signal line driver circuit, and a means for operating either of the first pixel portion or the second pixel portion.

20. An electronic apparatus using the light emitting device according to claim 17.

21. A portable phone using the light emitting device according to claim 17.

22. A personal digital assistance (PDA) using the light emitting device according to claim 17.

23. The light emitting device according to claim 17,
wherein at least one of the first reflecting film and the second reflecting film is formed of aluminum.

24. The light emitting device according to claim 17,
wherein at least one of the first counter electrode and the second counter electrode is formed of a transparent conductive film.

25. A light emitting device comprising:
a first pixel portion and a second pixel portion over a substrate;
a driver circuit positioned between the first pixel portion and the second pixel portion; and
a sealing material surrounding the first pixel portion, the second pixel portion, and the driver circuit,
wherein the first pixel portion comprises a first light emitting element that comprises:
a first pixel electrode comprising a first reflecting film;
a first electroluminescent layer over the first pixel electrode; and
a first counter electrode over the first electroluminescent layer, and
wherein the second pixel portion comprises a second light emitting element that comprises:
a second pixel electrode;
a second electroluminescent over the second pixel electrode;
a second counter electrode over the second electroluminescent layer; and
a second reflecting film over the second counter electrode;
wherein the first pixel portion and the second pixel portion are different from each other;
wherein the first light emitting element emits light in a direction from the first pixel electrode toward the first counter electrode; and
wherein the second light emitting element emits light in a direction from the second counter electrode toward the second pixel electrode.

26. The light emitting device according to claim 25 further comprising:
a first gate signal line driver circuit for operating the first pixel portion;
a second gate signal line driver circuit for operating the second pixel portion; and
a second source signal line driver circuit for operating the second pixel portion,
wherein the driver circuit is a first source signal line driver circuit further comprising a first driving portion for operating the first pixel portion.

27. The light emitting device according to claim 26 further comprising a wiring for supplying a signal or a voltage to the first source signal line driver circuit and the second source signal line driver circuit, and a means for operating either of the first pixel portion or the second pixel portion.

28. An electronic apparatus using the light emitting device according to claim 25.

29. A portable phone using the light emitting device according to claim 25.

30. A personal digital assistance (PDA) using the light emitting device according to claim 25.

31. The light emitting device according to claim 25,
wherein at least one of the first reflecting film and the second reflecting film is formed of aluminum.

32. The light emitting device according to claim 25,
wherein at least one of the first counter electrode and the second counter electrode is formed of a transparent conductive film.

* * * * *